US011923865B2

(12) United States Patent
Achard

(10) Patent No.: US 11,923,865 B2
(45) Date of Patent: Mar. 5, 2024

(54) DETECTING AND PREVENTING LIGHT-BASED INJECTION ATTACKS

(71) Applicant: Google LLC, Mountain View, CA (US)

(72) Inventor: Bertrand Achard, Sunnyvale, CA (US)

(73) Assignee: Google LLC, Mountain View, CA (US)

(*) Notice: Subject to any disclaimer, the term of this patent is extended or adjusted under 35 U.S.C. 154(b) by 227 days.

(21) Appl. No.: 17/518,979

(22) Filed: Nov. 4, 2021

(65) Prior Publication Data
US 2022/0060193 A1 Feb. 24, 2022

Related U.S. Application Data

(60) Provisional application No. 63/275,063, filed on Nov. 3, 2021.

(51) Int. Cl.
*H03M 1/06* (2006.01)
*B81B 7/02* (2006.01)
*H04R 19/04* (2006.01)

(52) U.S. Cl.
CPC ............ *H03M 1/0617* (2013.01); *B81B 7/02* (2013.01); *H04R 19/04* (2013.01); *H04R 2201/003* (2013.01)

(58) Field of Classification Search
CPC ... H03M 1/0617; B81B 7/02; H04R 2201/003
USPC .................................................. 341/118, 120
See application file for complete search history.

(56) References Cited

U.S. PATENT DOCUMENTS

| 10,620,913 | B2 | 4/2020 | Beatty et al. |
| 10,748,529 | B1 | 8/2020 | Milden |
| 2017/0257709 | A1* | 9/2017 | Cohen ..................... G06F 3/012 |
| 2019/0306617 | A1* | 10/2019 | Straeussnigg .......... H04R 19/04 |

FOREIGN PATENT DOCUMENTS

CN 111654794 9/2020

* cited by examiner

*Primary Examiner* — Peguy Jean Pierre
(74) *Attorney, Agent, or Firm* — Colby Nipper PLLC

(57) ABSTRACT

This document describes techniques and apparatuses directed at detecting and preventing light-based injection attacks. In aspects, a computing device includes executable instructions of an input manager, an audio sensor having subtracting circuitry, and a light sensor. One or more processors executing instructions of the input manager is configured to receive and analyze signals generated by the audio sensor, the light sensor, and the subtracting circuit. Upon analysis, the input manager can detect and prevent light-based injection attacks.

6 Claims, 6 Drawing Sheets

DETECTING AND PREVENTING LIGHT-BASED INJECTION ATTACKS

RELATED APPLICATION

This application claims priority under 35 U.S.C. § 119(e) to U.S. Provisional Patent Application 63/275,063, filed on Nov. 3, 2021, which is incorporated herein by reference in its entirety.

SUMMARY

This document describes techniques and apparatuses directed at detecting and preventing light-based injection attacks. In aspects, a computing device includes executable instructions of an input manager, an audio sensor having subtracting circuitry, and a light sensor. One or more processors executing instructions of the input manager is configured to receive and analyze signals generated by the audio sensor, the light sensor, and the subtracting circuit. Upon analysis, the input manager can detect and prevent light-based injection attacks.

This Summary is provided to introduce simplified concepts for detecting and preventing light-injected sensor input, which is further described below in the Detailed Description and is illustrated in the Drawings. This Summary is not intended to identify essential features of the claimed subject matter, nor is it intended for use in determining the scope of the claimed subject matter.

BRIEF DESCRIPTION OF THE DRAWINGS

The details of one or more aspects for detecting and preventing light-injected sensor input are described in this document with reference to the following drawings.

The use of same numbers in different instances may indicate similar features or components.

DETAILED DESCRIPTION

Overview

Computing devices continue to make significant contributions to modern society, such as in the realms of safety, transportation, communication, and manufacturing, further propelling their proliferation and integration into the daily lives of users. To facilitate integration, many computing devices afford users convenient means by which to control or navigate their devices. For instance, some computing devices allow users to perform in-the-air gestures to skip songs, offer biometric identifiers to unlock devices, squeeze sides of a device to activate an intelligent virtual assistant, speak voice commands to call friends, and many other methods of interaction to operate devices. These methods of interaction expedite user input and device output techniques, enhancing user experience by enabling users to quickly and conveniently operate their device. Due to the ever-increasing integration of computing devices into users' lives, these devices must continually enact difficult-to-penetrate, state-of-the-art physical and nonphysical (e.g., software) security defenses to thwart multi-domain attacks threatening to expose user data or harm users.

Unfortunately, there are always new efforts by bad actors to subvert the security of computing devices. Some approaches to computing device subversion target the various methods of interaction, exploiting certain device features to gain access to, extract data from, or falsify input data to a computing device. As an example, a recently discovered approach to bypass device security defenses involves injecting modulated light in or near a microphone to fabricate a voice command In so doing, an unauthorized user may be able to gain access to and control an exploited computing device, and devices wirelessly connected thereto.

This document describes techniques and apparatuses directed at detecting and preventing light-based injection attacks. In aspects, a computing device includes executable instructions of an input manager, an audio sensor having subtracting circuitry, and a light sensor. One or more processors executing instructions of the input manager is configured to receive and analyze signals generated by the audio sensor, the light sensor, and the subtracting circuit. Upon analysis, the input manager can detect and prevent light-based injection attacks.

The following discussion describes operating environments, techniques that may be employed in the operating environments, and example methods. In the context of the present disclosure, reference is made to the operating environment by way of example only.

Operating Environments

The following discussion describes operating environments, techniques that may be employed in the operating environments, and various devices or systems in which components of the operating environments can be embodied. In the context of the present disclosure, reference is made to the operating environments by way of example only.

Figure 1:
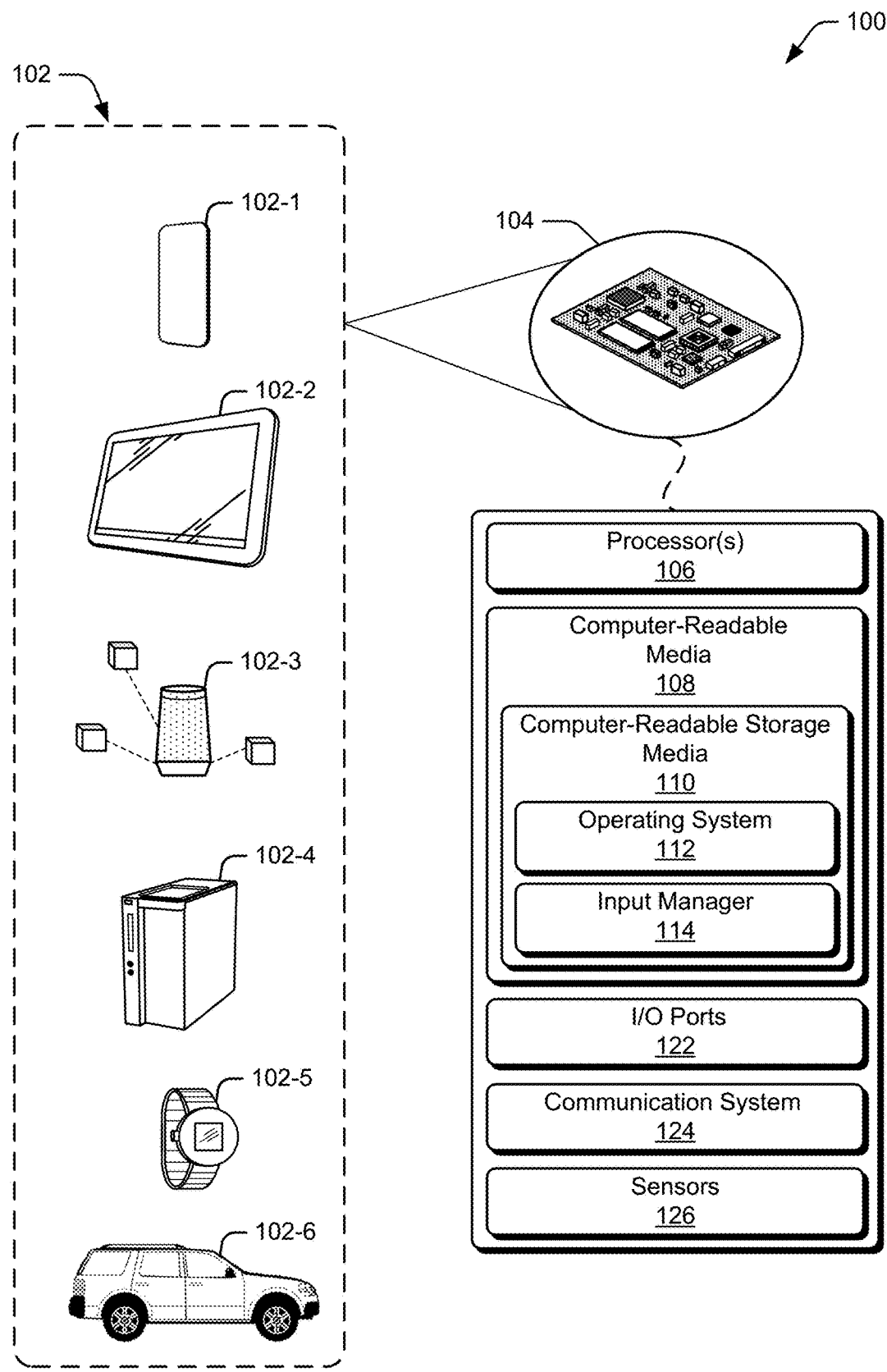
FIG. 1 illustrates an example operating environment that includes an example computing device, which is capable of detecting and preventing light-based injection attacks.

FIG. 1 illustrates an example operating environment 100 that includes an example computing device 102, which is capable of detecting and preventing light-based injection attacks. Examples of the computing device 102 include a smartphone 102-1, a tablet computer 102-2, a mesh network device 102-3, a gaming console 102-4, a wearable computing device 102-5 (e.g., computerized watch), and an automobile 102-6. Note that the electronic device 102 can be wearable, non-wearable but mobile, or relatively immobile (e.g., desktops, appliances). Note also that the electronic device 102 can be used with, or embedded within, many electronic devices 102 or peripherals, such as in automobiles or as an attachment to a laptop computer. The computing device 102 may provide other functions or include components or interfaces omitted from FIG. 1 for the sake of clarity or visual brevity.

The computing device 102 includes a printed circuit board assembly 104 (PCBA 104) on which components and interconnects of the computing device are embodied. Alternatively or additionally, components of the computing device 102 can be embodied on other substrates, such as flexible circuit material or other insulative material. The computing device 102 also includes a frame defining a housing having an internal cavity. Although not shown, various human-input devices, a display, a battery pack, antennas, and the like can be housed in the internal cavity of the device. Generally, electrical components and electromechanical components of the computing device 102 are assembled onto a printed circuit board (PCB) to form the PCBA 104.

As illustrated, the PCBA 104 includes one or more processors 106 and computer-readable media 108. The processor(s) 106 may be any suitable single-core or multi-core processor (e.g., a central processing unit (CPU)). The processor(s) 106 may be configured to execute instructions or commands stored within the computer-readable media 108 to implement an operating system 112 and input manager 114, which are stored within computer-readable storage media 110. The computer-readable storage media 110 may include one or more non-transitory storage devices or any type of media suitable for storing electronic instructions, each coupled with a computer system bus. The term "coupled" may refer to two or more elements that are in direct contact (physically, electrically, magnetically, optically, etc.) or to two or more elements that are not in direct contact with each other, but still cooperate and/or interact with each other.

The PCBA 104 may also include I/O ports 122 and communication systems 124. The I/O ports 122 allow the computing device 102 to interact with other devices or users through peripheral devices. The I/O ports 122 may include any combination of internal or external ports, such as universal serial bus (USB) ports, audio ports, PCI-express based ports or card-slots, secure digital input/output (SDIO) slots, and/or other legacy ports. Various peripherals may be operatively coupled with the I/O ports 122, such as human-input devices (HIDs), external computer-readable storage media, or other peripherals. The I/O ports 122 may transmit any combination of digital signals, analog signals, and radiofrequency signals.

The communication systems 124 enable communication of device data, such as received data, transmitted data, or other information as described herein. The communication systems 124 may include wired interfaces, such as Ethernet or fiber-optic interfaces for communication over a local network, private network, intranet, or the Internet. Alternatively or additionally, the communication systems 124 may include wireless interfaces that facilitate communication over wireless networks, such as wireless local area networks (LANs), cellular networks, or wireless personal area networks (WPANs).

The computing device 102 further includes a plurality of sensors 126 operably coupled to the PCBA 104 (e.g., on-device sensors, peripheral devices). The sensors 126 can include any of a variety of sensors, such as touch-input sensors (e.g., a touchscreen), image-capture devices (e.g., cameras, video-cameras), proximity sensors (e.g., capacitive sensors), or light sensors (e.g., photodetector, ambient light sensor). The computing device 102 may further include audio sensors, including micro-electro-mechanical system (MEMS) microphones, electret microphones, and the like.

Figure 2:
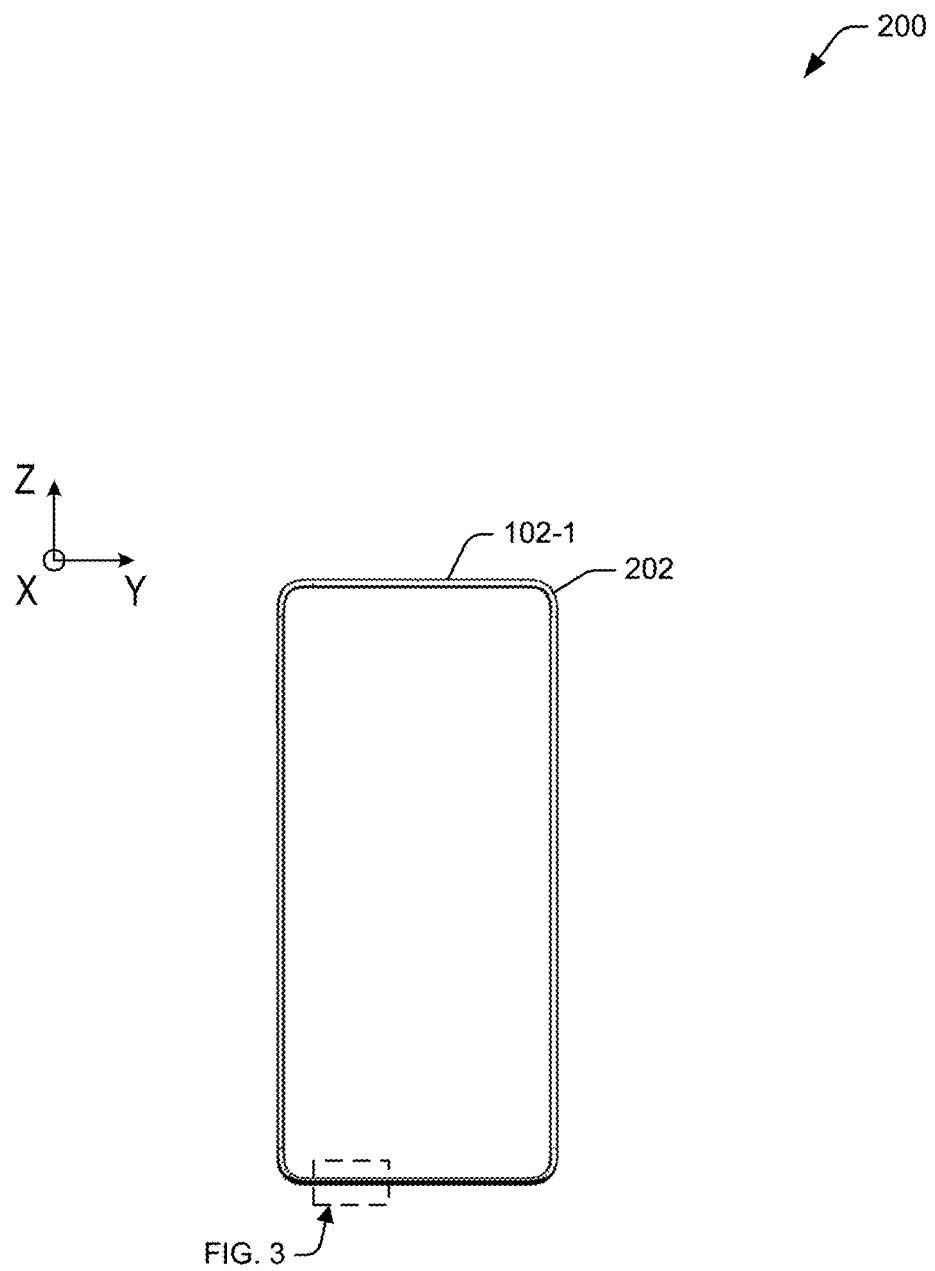
FIG. 2 illustrates an example computing device, implemented as a smartphone, having a frame including a passageway defining an aperture.

FIG. 2 illustrates an example computing device, implemented as a smartphone 102-1, having a frame 202 including a passageway defining an aperture (e.g., a hole, a channel). In some implementations, the frame 202 may be any of a variety of materials including metal (e.g., aluminum) or plastic. Further, the frame 202 may support one or more displays and/or grills (e.g., linen grill cloth, metal grill meshing).

The passageway may extend from the PCBA 104, or the sensor operably coupled to the PCBA 104, housed within the internal cavity of the smartphone 102-1 to an ambient environment. In some implementations, the passageway defining the aperture is void of material. In other implementations, a material (e.g., mesh, fabric) may be positioned within the aperture or proximately over the aperture opposite of the internal cavity. The material may be any of a variety of porous materials permitting sound waves and electromagnetic waves to pass from the ambient environment to one or more sensors.

Figure 3:
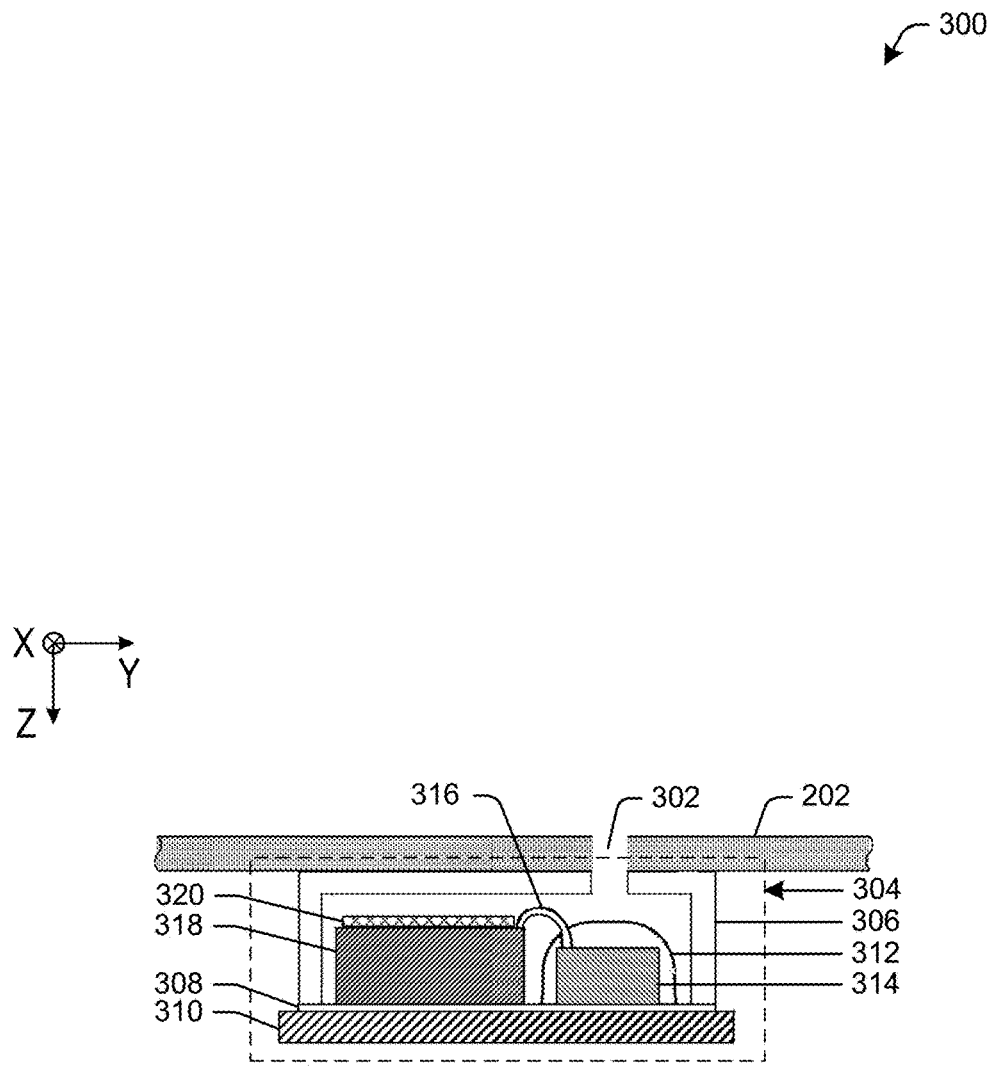
FIG. 3 illustrates the frame including the passageway defining the aperture and a micro-electro-mechanical system (MEMS) microphone.

FIG. 3 illustrates the frame 202 including the passageway 302 defining the aperture and a MEMS microphone 304. The MEMS microphone 304 includes a MEMS casing 306 attached (e.g., adhered, screwed) using a sealant 308 to a printed circuit board (PCB) 310 defining an interior of the MEMS microphone 304. As illustrated, the MEMS microphone 304 is positioned proximately within the internal cavity of smartphone 102-1 such that the passageway 302 extends from an interior of the MEMS microphone through a fabricated hole in the MEMS casing 306 to the ambient environment. Housed within the interior of the MEMS microphone is at least one of a glob top molding 312, an application-specific integrated circuit (ASIC) 314, wiring 316, and a MEMS transducer 318.

The glob top molding 312 (e.g., an electronic sealing encapsulant) may be composed of any of a variety of sealant compounds configured to protect circuity and electronic components in the MEMS microphone 304. For example, the glob top molding 312 protects the ASIC 314 from moisture, dust, debris, and solvents, as well as from mechanical strain and scratching. As illustrated, the glob top molding 312 encapsulates and protects the ASIC 314. The ASIC 314 includes a charge pump (not illustrated) configured to apply and maintain a fixed electric charge. Wiring 316 physically and electrically couples the ASIC 314 to the MEMS transducer 318. The MEMS transducer 318 includes a preamplifier and at least one sensing component 320 on one or more unobstructed faces. As illustrated in FIG. 3A, the MEMS transducer 318 includes the sensing component 320 on a top face of the MEMS transducer 318 opposite of the sealant 308.

Figure 4:
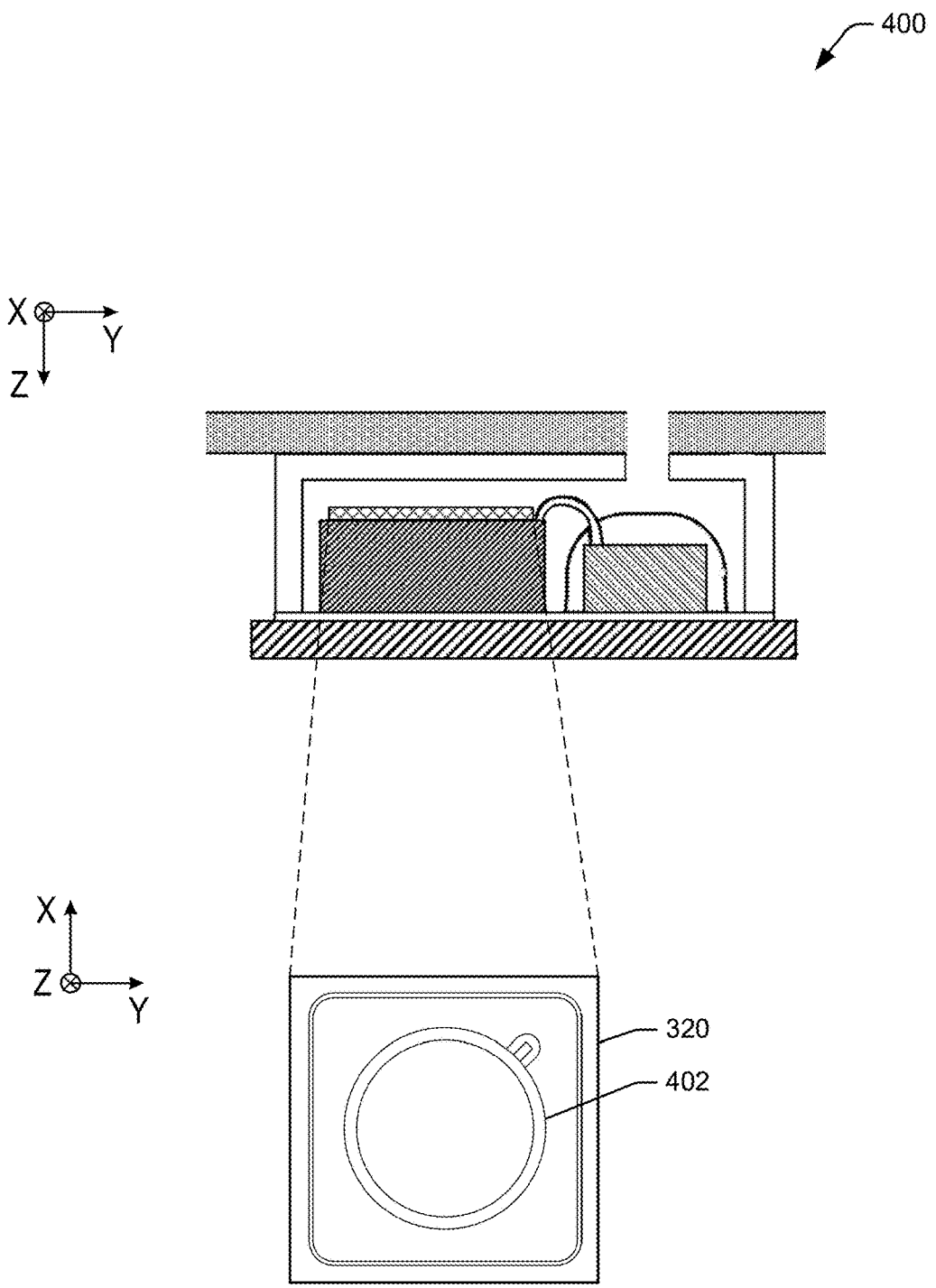
FIG. 4 illustrates the sensing component having a mechanical diaphragm.

FIG. 4 illustrates the sensing component 320 having a mechanical diaphragm 402. The mechanical diaphragm 402 is a membrane composed of a thin layer of conductive metal. The mechanical diaphragm 402 is configured to vibrate when activated by a wave, such as a sound wave. The mechanical diaphragm 402 is electrified by the charge pump of the ASIC 314 such that the mechanical diaphragm 402 possesses a fixed electric charge (e.g., 1.2e-11 coulombs). The sensing component 320 includes at least one back-plate (not illustrated). In an implementation, the back-plate and mechanical diaphragm 402 are configured to form a capacitor.

As an example, the smartphone 102-1 contains an analog MEMS microphone 304 having a MEMS transducer 318 with a sensing component 320. The sensing component 320 includes a back-plate and a mechanical diaphragm 402 configured to form a capacitor (e.g., one picofarad capacitor) electrified by a charge pump of an ASIC 314. The mechanical diaphragm 402 can oscillate in response to changing air pressure caused by sound waves, producing a varying capacitance. A preamplifier of the MEMS transducer 318 amplifies the varying capacitance, generating a time-variant electrical signal ("audio signal"). If a desired output signal of the MEMS microphone 304 is a digital signal, then an analog-to-digital converter (ADC) may convert the audio signal to a digital signal. The audio signal is then be transmitted through the electrical wires 316 to the ASIC 314.

In other implementations, the smartphone 102-1 can implement an alternately configured MEMS microphone 304 (e.g., a digital MEMS microphone) and/or a different sensor. As an example, the ASIC 314 may be integrated on the same substrate of the MEMS microphone 304. Further to the above descriptions, the MEMS microphone 304 may be positioned anywhere on the device, such as on a front-facing portion, a back-facing portion, or in the internal cavity of the computing device 102. In other implementations, the MEMS microphone 304 may be implemented as a peripheral device operably coupled to the PCBA 104 (not shown). The MEMS microphone 304 package may range in size from several millimeters to less than one micrometer.

The smartphone 102-1 further includes one or more light sensors capable of detecting and preventing light-based injection attacks. The term light-based, as described herein, refers to electromagnetic radiation of any frequency generated by an electromagnetic radiation emitting device. As an example, the electromagnetic radiation emitting device can utilize light amplification by stimulated emission of radiation (laser) at various wavelengths effective to produce any of a variety of physical or electrical effects, including a photoacoustic effect (e.g., the formation of sound waves following light absorption in a sample material), a photovoltaic effect (e.g., the generation of voltage and electric current in a material upon exposure to electromagnetic radiation), a photoelectric effect (e.g., the phenomenon in which electrically charged particles are released from or within a material when it absorbs electromagnetic radiation), and so forth. Further to the above descriptions, the electromagnetic radiation may be modulated light (e.g., a spatially varying modulation on a beam of light).

In implementations, the light sensor(s) is configured to detect electromagnetic radiation in a 3 terahertz (THz) to 3 petahertz (PHz) frequency range. Further, the light sensor(s) may be integrated in various positions within the smartphone 102-1, such as in the MEMS microphone 304, underneath a display, and so forth. The light sensor(s) is operably coupled to the ASIC 314. In another implementation, the light sensor(s) is operably coupled to the processor(s) 106.

Figure 5:
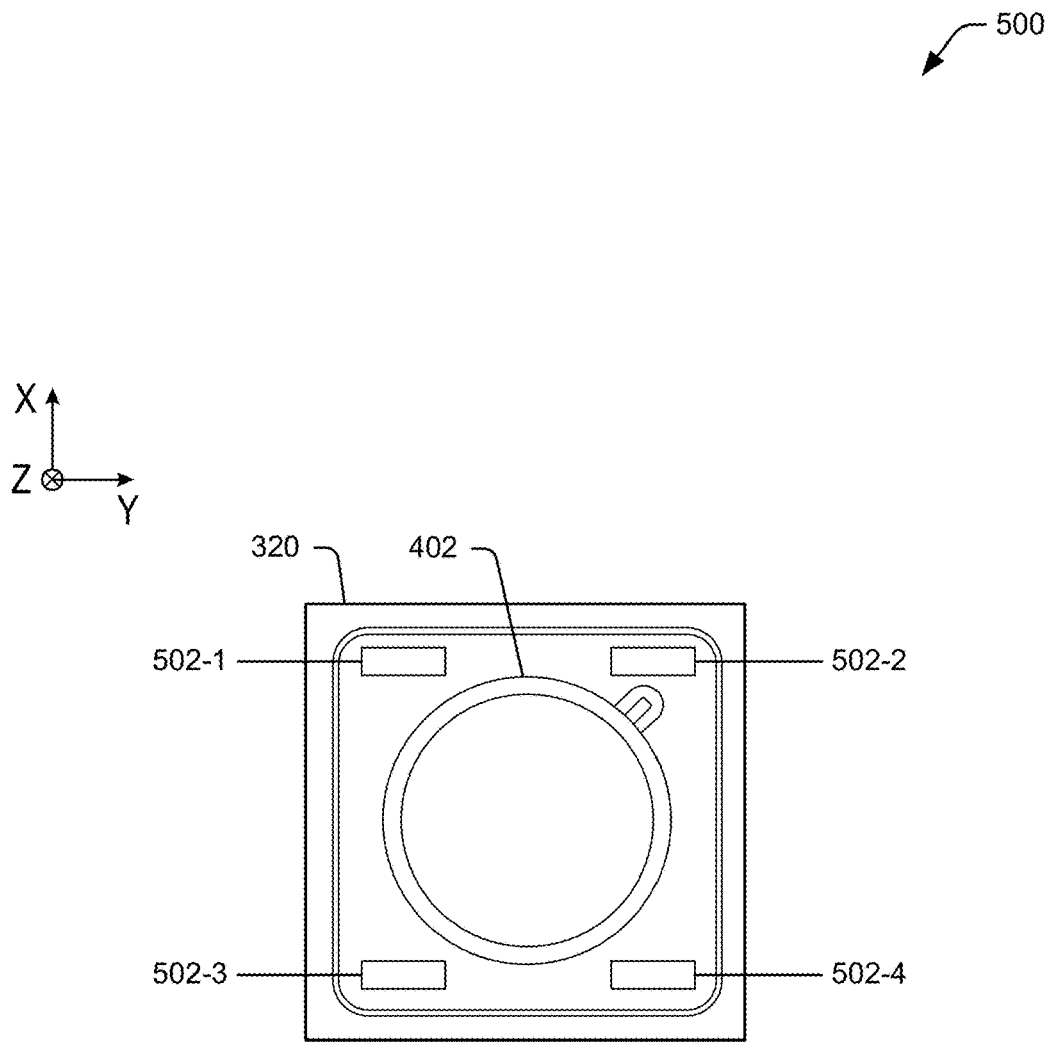
FIG. 5 illustrates light sensors integrated in the MEMS microphone on the MEMS transducer.

FIG. 5 illustrates light sensors 502 integrated in the MEMS microphone 304 on the MEMS transducer 318. As illustrated, light sensors 502 (e.g., light sensor 502-1, light sensor 502-2, light sensor 502-3, light sensor 502-4) are integrated on the sensing component 320 of the MEMS transducer 318. The light sensors 502 may be implemented in a variety of configurations on the sensing component 320.

In aspects, the mechanical diaphragm 402 is activated by electromagnetic waves (e.g., electromagnetic radiation propagating as waves) and, as a result, produces a varying capacitance. For example, modulating electromagnetic radiation transmitted through the passageway 302 into the MEMS microphone 304 illuminates the mechanical diaphragm 402 of the MEMS transducer 318. Due to the photoacoustic effect, absorption of the modulating electromagnetic radiation (e.g., a short-pulsed laser light) by the mechanical diaphragm 402 causes differential thermoelastic expansion, forming pressure waves (e.g. sound waves). The differential thermoelastic expansion may cause the mechanical diaphragm 402 to oscillate, producing a varying capacitance. The preamplifier of the MEMS transducer 318 may then amplify the varying capacitance, generating a time-variant electrical signal. As a result, modulating electromagnetic radiation illuminating the mechanical diaphragm 402 is effective to produce an audio signal. In some instances, the modulated electromagnetic radiation may possess waveform characteristics similar to a sound wave having a voice command.

Parallel to the detection of the modulated electromagnetic radiation by the MEMS transducer 318, the light sensors 502 in the MEMS microphone 304 also detect the modulated electromagnetic radiation. The light sensors 502 can then generate and pass an electrical signal ("light signal") to the ASIC 314. The received light signal may possess similar waveform characteristics to the audio signal.

Figure 6:
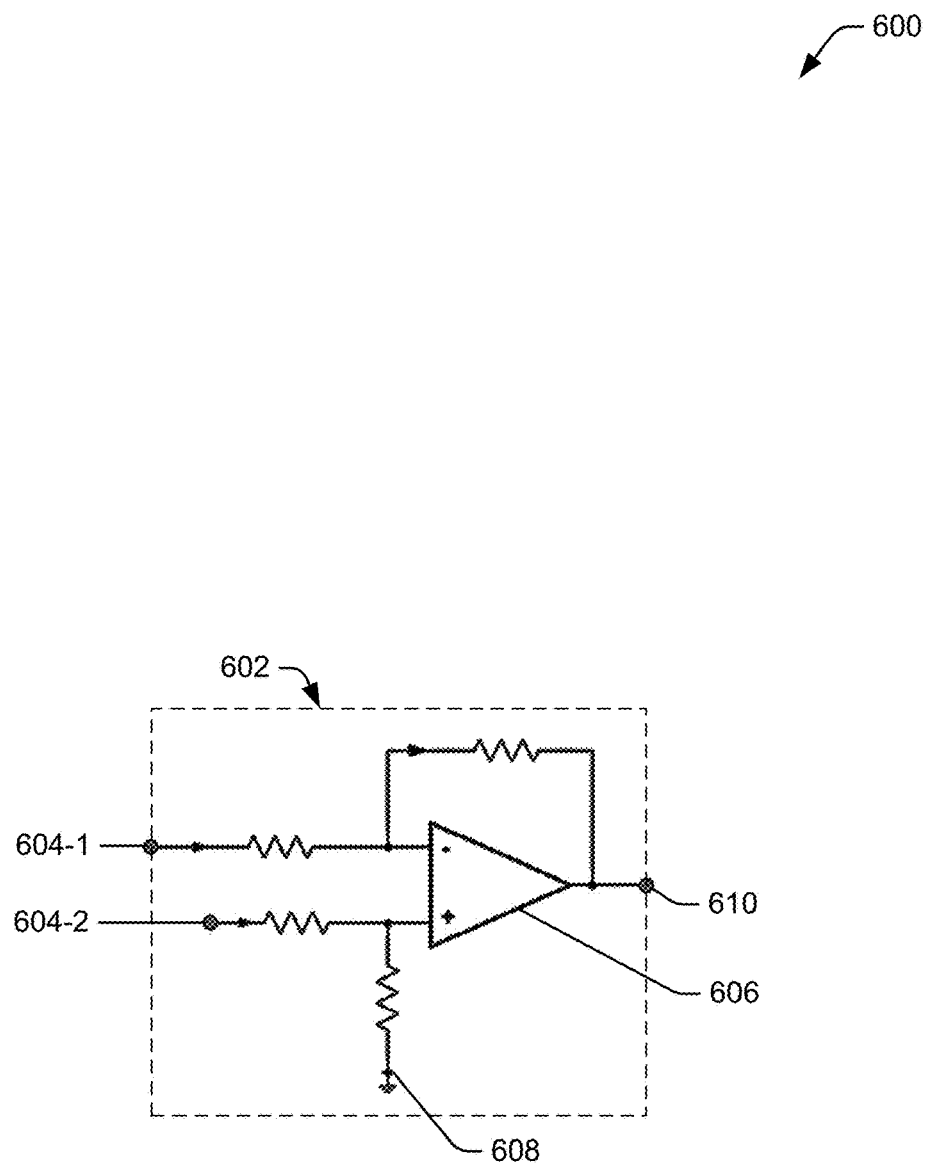
FIG. 6 illustrates an example subtracting circuit configured to receive an audio signal and a light signal, subtract the signals applied to the respective inputs, and produce an output signal.

In an implementation, while receiving both the audio signal and the light signal, the ASIC 314 having subtracting circuitry (e.g., a differential amplifier) may subtract the light signal from the audio signal. FIG. 6 illustrates an example subtracting circuit configured to receive an audio signal and a light signal, subtract the signals applied to the respective inputs, and produce an output signal. As illustrated, the subtracting circuit is a differential amplifier 602 having inputs 604, an operational amplifier (OP AMP) 606, a ground voltage node 608, and an output 610. In an implementation, the input 604-1 receives the light signal, while input 604-2 receives the audio signal. The differential amplifier 602 may be configured as a unity gain differential amplifier such that the voltage gain of the amplifier is equal to one. In such a configuration, the light signal is subtracted from the audio signal, producing an output signal at output 610. As a result, data (e.g., voice commands) injected into the MEMS transducer 318 via modulated electromagnetic radiation can be rejected by the MEMS microphone 304.

In implementations, the ASIC 314 transmits the audio signal, the light signal, and the output signal to processor(s) 106. Upon receipt of the signals, the processor(s) 106 execute instructions of an input manager 114 to determine a light-based injection attack is being attempted. In other implementations, the ASIC 314 can directly pass the audio signal and light signal to the processor(s) 106. In such an implementation, the processor(s) 106 may execute instructions of the input manager 114 to subtract the light signal from the audio signal and determine whether a light-based injection attack is being attempted.

The techniques and apparatuses described herein enable a computing device to detect and prevent light-based injection attacks. Such an implementation enables the computing device to, optionally, warn a user and perform operations with a heightened alertness, including denying all voice commands if exceeding a predetermined threshold. Further, the techniques described herein do not hinder audio sensing through design modifications attempting to hinder light injection attacks. In addition, integrating light sensors within the MEMS microphone reduces costs, since the MEMS microphone package already possesses physical and electrical compatibility.

What is claimed is:

1. A computing device comprising:
   an audio sensor, the audio sensor configured to detect differences in air pressure and generate first electrical signals;
   a light sensor, the light sensor configured to detect electromagnetic radiation and generate second electrical signals;
   at least one processor; and
   at least one computer-readable storage medium comprising instructions of an input manager that, when executed by the at least processor, cause the processor to perform signal subtraction of the second electrical signals generated by the light sensor from the first electrical signals generated by the audio sensor.

2. The computing device of claim 1, wherein the audio sensor is a micro-electro-mechanical system (MEMS) microphone.

3. The computing device of claim 1, wherein the light sensor is integrated within the audio sensor.

4. The computing device of claim 1, wherein the light sensor is configured to detect electromagnetic radiation in a 3 terahertz (THz) to 3 petahertz (PHz) frequency range.

5. The computing device of claim 1, wherein the at least one processor executing instructions of an input manager detects and prevents a light-based injection attack, and further warns a user.

6. A micro-electro-mechanical system (MEMS) microphone, the MEMS microphone comprising:
- a MEMS transducer, the MEMS transducer having at least one backplate and a mechanical diaphragm forming a capacitor, the mechanical diaphragm configured to oscillate in response to changing air pressure, generating a first electrical signal;
- at least one light sensor, the light sensor configured to detect electromagnetic radiation and generate a second electrical signal; and
- a differential amplifying circuit, the differential amplifying circuit configured to receive the first and second electrical signals from the MEMS transducer and the light sensor, respectively, and produce a third electrical signal that is a difference between the first and second electrical signals.

* * * * *